United States Patent [19]
Krautschneider et al.

[11] Patent Number: 6,064,101
[45] Date of Patent: May 16, 2000

[54] READ-ONLY MEMORY CELL ARRANGEMENT

[75] Inventors: Wolfgang Krautschneider, Hohenthann; Frank Lau, Bruckmühl; Franz Hofmann, München, all of Germany

[73] Assignee: Siemens Aktiengesellschaft, Munich, Germany

[21] Appl. No.: 09/077,268

[22] PCT Filed: Dec. 5, 1996

[86] PCT No.: PCT/DE96/02328

§ 371 Date: Jun. 8, 1998

§ 102(e) Date: Jun. 8, 1998

[87] PCT Pub. No.: WO97/22139

PCT Pub. Date: Jun. 19, 1997

[30] Foreign Application Priority Data

Dec. 8, 1995 [DE] Germany ............... 195 45 903

[51] Int. Cl.[7] .................................. H01L 27/112
[52] U.S. Cl. ................. 257/390; 257/391; 257/411
[58] Field of Search ............................ 257/390, 391, 257/405, 406, 411

[56] References Cited

U.S. PATENT DOCUMENTS

| | | | |
|---|---|---|---|
| 5,300,804 | 4/1994 | Arai | 257/332 |
| 5,306,941 | 4/1994 | Yoshida | 257/390 |
| 5,453,637 | 9/1995 | Chune et al. | 257/390 |
| 5,747,856 | 5/1998 | Chen et al. | 257/390 |
| 5,751,040 | 5/1998 | Chen et al. | 257/332 |

FOREIGN PATENT DOCUMENTS

| | | |
|---|---|---|
| 195 10 042 A1 | 9/1996 | Germany . |
| 2-106966 | 4/1990 | Japan . |
| 3-190165 | 8/1991 | Japan . |
| 4-226071 | 8/1992 | Japan . |
| 5-308135 | 11/1993 | Japan . |

*Primary Examiner*—John Guay
*Attorney, Agent, or Firm*—Hill & Simpson

[57] ABSTRACT

A read-only memory cell arrangement having planar MOS transistors which are arranged in parallel rows. Neighboring rows run alternately on the bottom of longitudinal trenches and run between neighboring longitudinal trenches. Bit lines run transversely and word lines run parallel to the longitudinal trenches. The memory cell arrangement can be produced with an area per memory cell of $2F^2$ (F-minimum structure size).

6 Claims, 6 Drawing Sheets

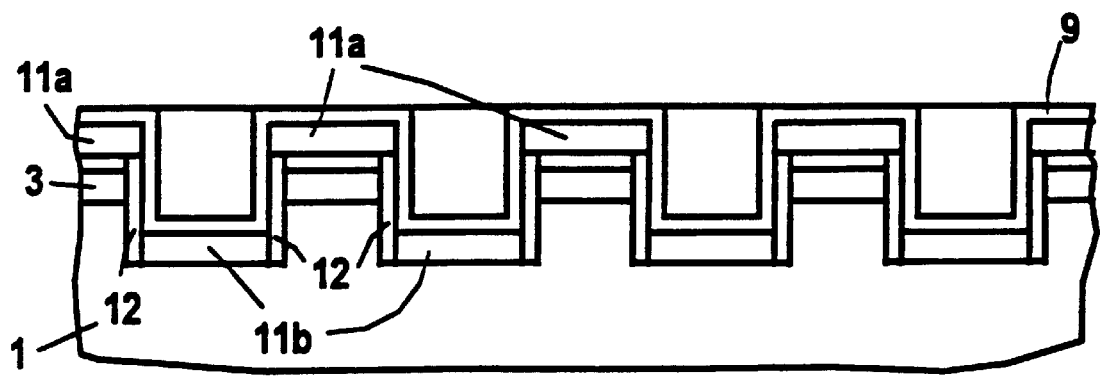
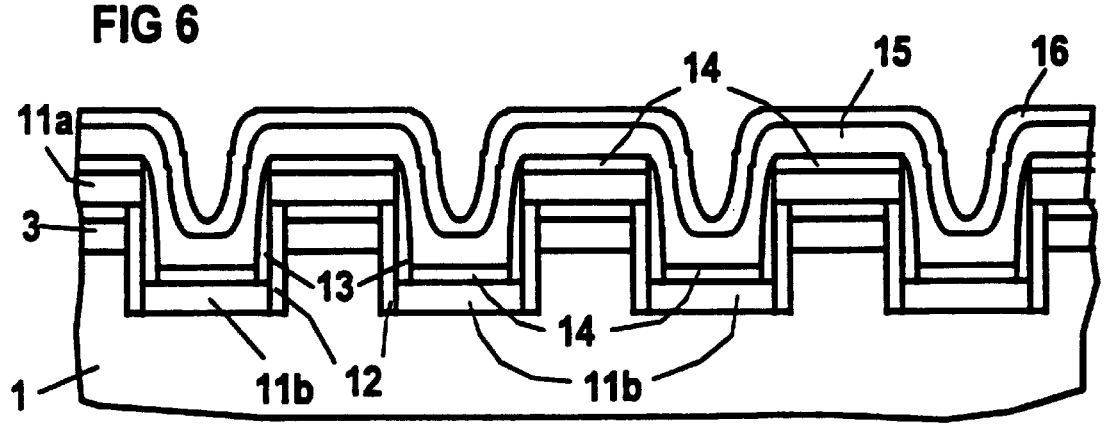

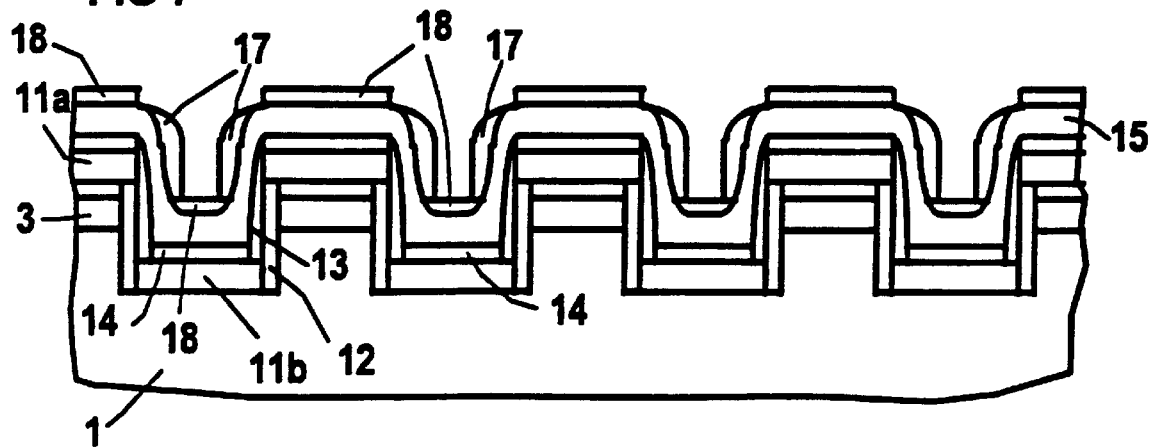
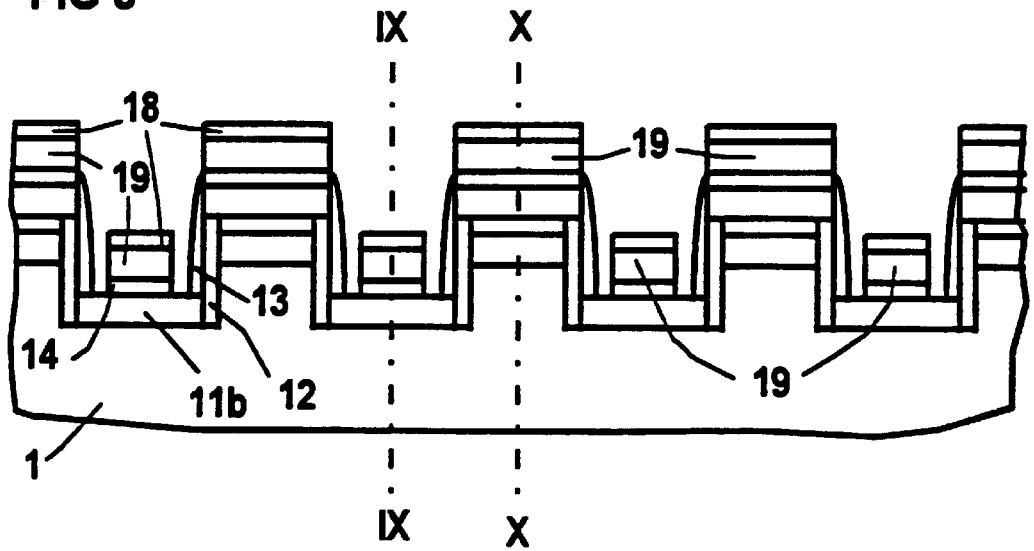

READ-ONLY MEMORY CELL ARRANGEMENT

BACKGROUND OF THE INVENTION

1. Field of the Invention

The present invention relates to a semiconductor-based read-only memory cell arrangement which can be produced with both a small number of production steps and a high yield and which exhibits increased storage density.

2. Description of the Prior Art

Memories to which data are written permanently are required for many electronic systems. Such memories are referred to, inter alia, as read-only memories.

Plastic disks coated with aluminum are in wide-spread use as read-only memories for very large volumes of data. These plastic disks have two different kinds of point-like depressions in coating which are respectively assigned to the logic values zero and one. The information is stored digitally in the arrangement of these depressions. Such disks are referred to as compact disks and are widely used for the digital storage of music.

In order to read the data which are stored on a compact disk, the disk is rotated mechanically using a reading apparatus. The point-like depressions are scanned by means of a laser diode and a photocell. Typical scanning rates in this case are 2×40 kHz. 5 Gbits of information can be stored on one compact disk.

The reading apparatus has moving parts which are subjected to mechanical wear, require a comparatively large volume and allow only slow data access. The reading apparatus is furthermore sensitive to vibrations and can thus be used only to a limited extent in mobile systems. Semiconductor-based read-only memories are known for the storage of smaller volumes of data. These memories are often formed as a planar integrated silicon circuit in which MOS transistors are used. The MOS transistors are respectively selected via the gate electrode connected to the word line. The input of the MOS transistor is connected to a reference line while the output is connected to a bit line. An assessment is carried out during the reading operation to determine whether or not a current is flowing through the transistor. The stored information is assigned accordingly. In technical terms, the storage of the information is usually effected by the MOS transistors having different threshold voltages as a result of different implantation in the channel region.

These semiconductor-based memories allow random access to stored information. The electrical power required to read the information is distinctly less than in a reading apparatus having a mechanical drive. Since a mechanical drive is not required to read the information, the mechanical wear and the sensitivity to vibrations are obviated. Semiconductor-based read-only memories can therefore be used for mobile systems as well.

In order to increase the storage density in planar silicon memories, it has been proposed to arrange the MOS transistors in rows. In each row, the MOS transistors are connected in series. The MOS transistors are read out by row-by-row driving in the sense of a NAND or NOR architecture. This requires only two terminals per row wherein the MOS transistors arranged in the row are connected in series between the terminals. Source/drain regions, connected to one another, of neighboring MOS transistors can then be formed as a coherent doped region. This enables the area requirement per memory cell to be reduced to a theoretical value of $4F^2$ (F-smallest structure size that can be produced using the respective technology). Such a memory cell arrangement is disclosed, for example, in H. Kawagoe and N. Tsuji, IEEE J. Solid-State Circ., vol. SC-11, P. 360 (1976).

SUMMARY OF THE INVENTION

The present invention is directed to a semiconductor-based read-only memory cell arrangement in which an increased storage density is achieved and which can be produced with both a small number of production steps and a high yield. The present invention is further directed to a method for producing such a memory cell arrangement.

The read-only memory cell arrangement of the present invention includes a multiplicity of individual memory cells in a semiconductor substrate which is preferably made of monocrystalline silicon. The memory cells each include at least one MOS transistor. The memory cells are each arranged in rows which are substantially parallel. Longitudinal trenches, which run substantially parallel to the rows, are provided in a main area of the semiconductor substrate. The rows are alternately arranged on the main area between neighboring longitudinal trenches and on the bottom of the longitudinal trenches. Bit lines run transversely with respect to the rows and are each connected to source/drain regions of MOS transistors arranged along different rows. Word lines are arranged above the rows and are each connected to the gate electrodes of MOS transistors arranged along a row.

In order to prevent conductive channels being formed between neighboring rows in the semiconductor substrate, it is advantageous to provide doped layers in the semiconductor substrate between neighboring longitudinal trenches. Such doped layers act as a channel stopper.

The read-only memory cell arrangement can be formed with an area requirement per memory cell of $2F^2$ (F-minimum structure size in the respective technology). For this purpose, the MOS transistors of memory cells arranged along a row are connected in series. Source/drain regions, connected to one another, of neighboring MOS transistors along a row are correspondingly designed as a coherent doped region in the semiconductor substrate. Source/drain regions which are connected along a bit line, or transversely with respect to the longitudinal trenches, are connected to one another via doped regions in the semiconductor substrate. The doped regions are arranged in each of the side walls of the longitudinal trenches. In such an embodiment, the bit lines are respectively formed by both the source/drain regions and the doped regions in the side walls of the longitudinal trenches.

If the longitudinal trenches are formed with a trench width of F and at a distance F, and if the extend of the coherent doped regions respectively acting as source/drain regions, connected to one another, of two MOS transistors amounts to F, and if the extent of the channel region amounts to F, then the resulting space requirement per memory cell is $2F^2$ because each of the coherent doped regions belongs to two neighboring memory cells and because neighboring rows of memory cells are arranged directly next to one another. Insulation between neighboring rows of memory cells is ensured by the arrangement on the bottom of the longitudinal trench and on the main area of the semiconductor substrate between neighboring longitudinal trenches.

It lies within the scope of the present invention that the MOS transistors have different threshold voltages depending on the information stored in the respective memory cell. In order to store data in a digital form, the MOS transistors have two different threshold voltages. If the read-only memory cell arrangement is to be used for multivalue logic, then the MOS transistors have more than two different threshold voltages depending on the stored information. It also lies within the scope of the present invention to realize different threshold voltages of the MOS transistors through different channel dopings of the MOS transistors.

According to one embodiment of the present invention, the MOS transistors have a dielectric multilayer coating as gate dielectric. The dielectric multilayer coating is provided with at lest one layer which has an increased electron capture cross-section compared with at lest one further layer in the multilayer coating. The dielectric multilayer coating preferably includes an $SiO_2$ layer, an $Si_3N_4$ layer and an $SiO_2$ layer (so-called ONO). This embodiment of the read-only memory cell arrangement is one-time programmable by injecting electrons from the channel region of the MOS transistors into the multilayer coating. The injected electrons are retained by traps in the depletion layer between $SiO_2$ and $Si_3N_4$ and increase the threshold voltage of the MOS transistor. In this way, the threshold voltage of the respective MOS transistor is varied in a targeted manner depending on the information to be stored in the respective memory cell.

The read-only memory cell arrangement is preferably produced using self-aligning process steps wherein the space requirement per memory cell can be reduced. In order to produce the read-only memory cell arrangement, longitudinal trenches running substantially parallel are etched in a main area of a semiconductor substrate. A multiplicity of memory cells which are arranged in rows, and which each include at least one MOS transistor, are produced wherein the rows are arranged alternately on the main area between neighboring longitudinal trenches and on the bottom of the longitudinal trenches. The source/drain regions of the MOS transistors are produced by implantation wherein a source/drain mask is used which defines the arrangement of the source/drain regions of the memory cells. Using the source/drain mask as an implantation mask, doped regions are subsequently formed by angled implantation in the side walls of the longitudinal trenches. Such doped regions connect together source/drain regions arranged along different rows. Word lines, which are each connected to the gate electrodes of MOS transistors arranged along a row, are produced above the rows. The source/drain regions which are connected to one another via doped regions in the side walls of the longitudinal trenches, and which are arranged along different rows, form bit lines in the read-only memory cell arrangement.

In order to suppress the formation of conductive channels in the semiconductor substrate between neighboring rows it is advantageous to produce a doped layer prior to the formation of the longitudinal trenches in the semiconductor substrate. Such doped layer is etched through during the etching of the longitudinal trenches and acts as a channel stopper in the read-only memory cell arrangement.

Additional features and advantages of the present invention are described in, and will be apparent from, the Detailed Description of the Preferred Embodiments and from the Drawings.

DESCRIPTION OF THE DRAWINGS

FIG. 5 shows the section through the silicon substrate which is designated by V—V in FIG. 3.

FIG. 6 shows a section through the silicon substrate of FIG. 3 after the formation of a gate dielectric and the deposition of both a conductive layer and an $Si_3N_4$ layer.

FIG. 7 shows a section through the silicon substrate of FIG. 6 after the formation of $Si_3N_4$ spacers and an oxide mask for structuring the conductive layer.

FIG. 8 shows a section through the silicon substrate of FIG. 7 after the formation of word lines by structuring of the conductive layer.

DETAILED DESCRIPTION OF THE PREFERRED EMBODIMENTS

In order to produce a read-only memory cell arrangement in a substrate 1 made of, for example, monocrystalline silicon an insulation structure which defines the region of the read-only memory cell arrangement (not illustrated) and and which may define active regions for a peripheral area of the read-only memory cell arrangement is produced on a main area 2 of the substrate 1. The insulation structure is formed, for example, in a LOCOS process or in a shallow trench insulation process. The substrate 1 is, for example, p-doped with a dopant concentration of $5 \times 10^{15}$ cm$^{-3}$.

Figure 1:
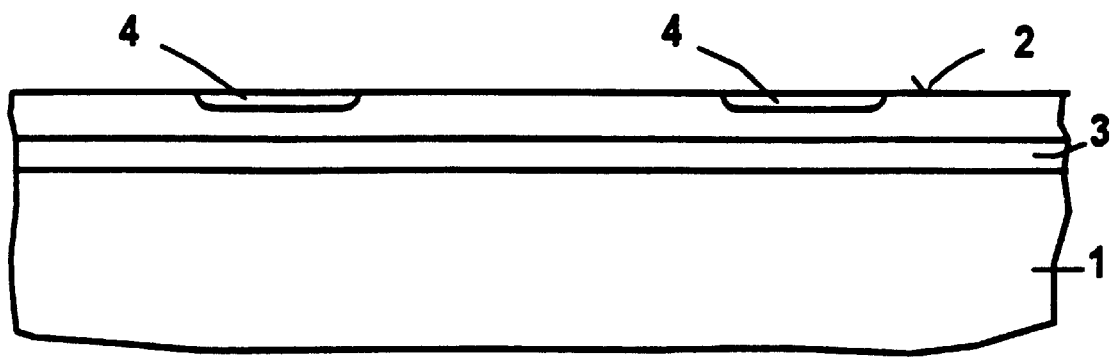
FIG. 1 shows a silicon substrate after a first channel implantation.

Implantation with boron is subsequently carried out in order to form a channel stop layer 3. The boron implantation is carried out with, for example, a dose of $6 \times 10^{13}$ cm$^{-2}$ and an energy of 120 keV. As a result, the channel stop layer 3 is produced at a depth of 0.3 $\mu$m, for example, below the main area 2 with a thickness of 0.3 $\mu$m (see FIG. 1).

A photolithographic process is then used to define regions for the depletion channels of MOS transistors. The depletion channels 4 are formed with the aid of a first channel implantation using arsenic with an energy of 50 keV and a dose of $4 \times 10^{13}$ cm$^{-2}$, for example. The extent of the depletion channels 4 parallel to the main area 2 is 0.6 $\mu$m$\times$0.6 $\mu$m, for example, if a 0.4 $\mu$m technology is used.

Figure 2:
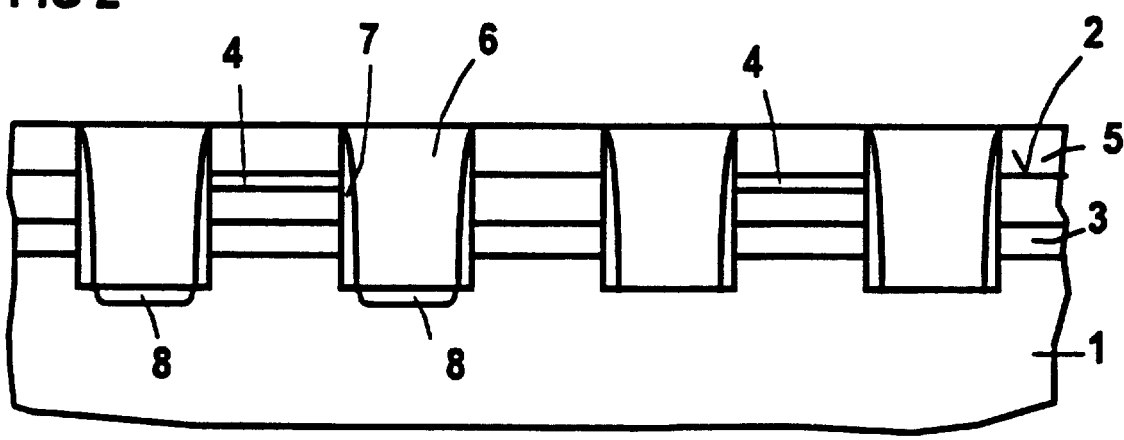
FIG. 2 shows the silicon substrate of FIG. 1 after trench etching and a second channel implantation.

By depositing an $SiO_2$ layer to a thickness of 200 nm, for example, with the aid of a TEOS process, a trench mask 5 is formed by structuring the $SiO_2$ layer with the aid of photolithographic processes (see FIG. 2).

Longitudinal trenches 6 are etched by anisotropic etching with $Cl_2$, for example, using the trench mask 5 as an etching mask. The longitudinal trenches 6 have a depth of 0.6 $\mu$m, for example. The longitudinal trenches 6 reach down into the substrate 1 and cut through the channel stop layer 3. The width of the depletion channels 4 is set during the etching of the longitudinal trenches 6. For this reason, the alignment of the trench mask 5 relative to the depletion channels 4 is not critical.

Spacers 7 made of $SiO_2$ are formed on the side walls of the longitudinal trenches 6 by depositing a further $SiO_2$ layer using a TEOS process and subsequent anisotropic etching. A photolithographic process is subsequently used to define regions for the depletion channels for MOS transistors which are subsequently produced on the bottom of the longitudinal trenches 6. Depletion channels 8 are produced on the bottom of the longitudinal trenches 6 by means of a second channel implantation with, for example, arsenic and an energy of 50 keV and a dose of $4 \times 10^{13}$ cm$^{-2}$. The regions between neighboring longitudinal trenches 6 are masked in the process by the trench mask 5 and the spacers 7. Therefore, alignment during the definition of the depletion channels 8 is not critical. The second channel implantation is self-aligned with regard to the side walls of the longitudinal trenches 6.

The trench mask 5 is subsequently removed wet-chemically using NH$_4$F/HF, for example. The spacers 7 are removed at the same time.

A thin SiO$_2$ layer 9 is grown to a thickness of 20 nm, for example, on the silicon surface. The thin SiO$_2$ layer 9 improves the silicon surface in the sense of a sacrificial oxide.

Figure 3:
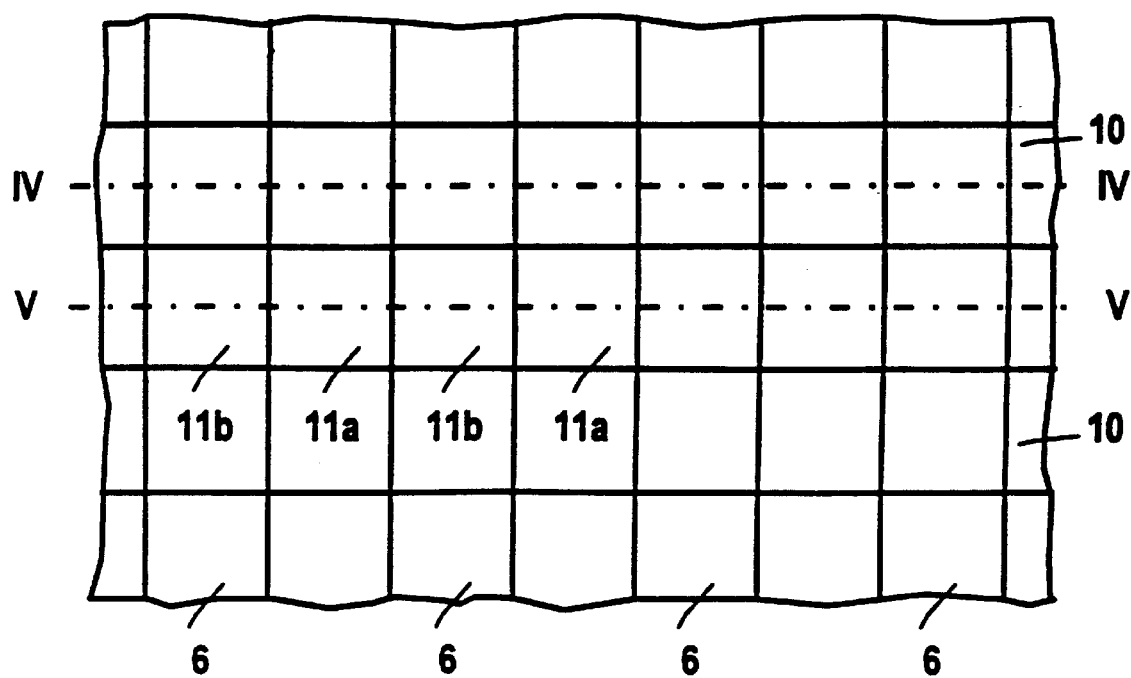
FIG. 3 shows a plan view of the silicon substrate of FIG. 2 with a source/drain mask after an implantation for the purpose of forming the source/drain regions, and an angled implantation for the purpose of forming doped regions in the side walls of the longitudinal trenches.
Figure 4:
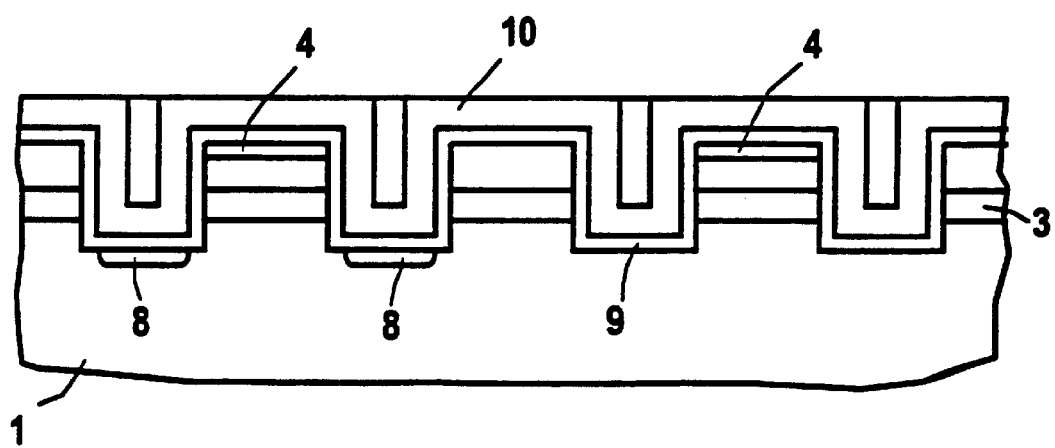
FIG. 4 shows the section through the silicon substrate which is designated by IV—IV in FIG. 3.

A polysilicon layer is subsequently deposited over the whole area. The polysilicon layer is produced with a thickness of 500 nm, for example and is intrinsically doped. With the aid of photolithographic process steps, a source/drain mask 10 is formed by structuring the polysilicon layer (see FIG. 3, FIG. 4, FIG. 5). The source/drain mask 10 defines the arrangement of source/drain regions to be produced afterwards. The source/drain mask 10 has polysilicon strips which cover the silicon surface in each of the regions in which channel regions for MOS transistors are subsequently produced.

By implanting arsenic with an energy of approximately 80 keV and a dose of approximately $5 \times 10^{15}$ cm$^{-2}$, upper source/drain regions 11$a$ are respectively formed in the region of the main area 2 between neighboring longitudinal trenches 6 and lower source/drain regions 11$b$ are respectively formed on the bottom of the longitudinal trenches 6. The implantation is carried out substantially perpendicularly with respect to the main area 2 (see FIG. 3 and FIG. 5).

Doped regions 12 are formed in the side walls of the longitudinal trenches 6 by ion implantation with an angle of inclination of 40°, for example, such doped regions respectively connect an upper source/drain region 11$a$ to a lower source/drain region 11$b$ (see FIG. 5). The angled implantation is carried out, for example, using arsenic with an energy of $5 \times 10^{15}$ cm$^{-2}$ and a dose of $5 \times 10^{15}$ cm$^{-2}$.

The source/drain mask 10 is subsequently removed by dry or wet etching which attacks polysilicon selectively with respect to SiO$_2$. Accordingly, the thin SiO$_2$ layer 9 acts as an etching stop. The source/drain mask 10 is removed, for example, by wet etching using polysilicon etchant (HF/HNO$_3$/H$_2$O) or by dry etching using HBr and Cl$_2$.

The thin SiO$_2$ layer 9 is subsequently removed using hydrofluoric acid (HF), for example.

SiO$_2$ spacers 13 are formed on the side walls of the longitudinal trenches 6 by deposition of an SiO$_2$ layer in a TEOS process and subsequent anisotropic etching (see FIG. 6).

A gate dielectric 14 made of SiO$_2$, for example, is formed to a thickness of 10 nm, for example, by thermal oxidation. An oxidation conductive layer 15 is subsequently produced over the whole area to a thickness of approximately 100 to 200 nm. The oxidizable conductive layer 15 is preferably formed from doped polysilicon. As an alternative, the oxidizable conductive layer 15 may be formed of a metal silicide or a combination of doped polysilicon and silicide.

An Si$_3$N$_4$ layer 16 is deposited over the whole area to a thickness of 30 to 80 nm, for example. Planar parts of the Si$_3$N$_4$ layer 16 are removed by anisotropic etching and Si$_3$N$_4$ spacers 17 are formed. In the process, the surface of the oxidizable conductive layer 15 is uncovered in planar regions. The Si$_3$N$_4$ spacers 17 cover the oxidizable conductive layer 15 in the region of the side walls of the longitudinal trenches 6 (see FIG. 7).

Uncovered regions of the oxidizable conductive layer 15 are subsequently oxidized. The Si$_3$N$_4$ spacers 17 act as an oxidation mask and allow selective oxidation in the planar regions of the oxidizable conductive layer 15. In the process, an oxide mask 18 is formed which covers the planar regions of the oxidizable conductive layer 15.

Figure 9:
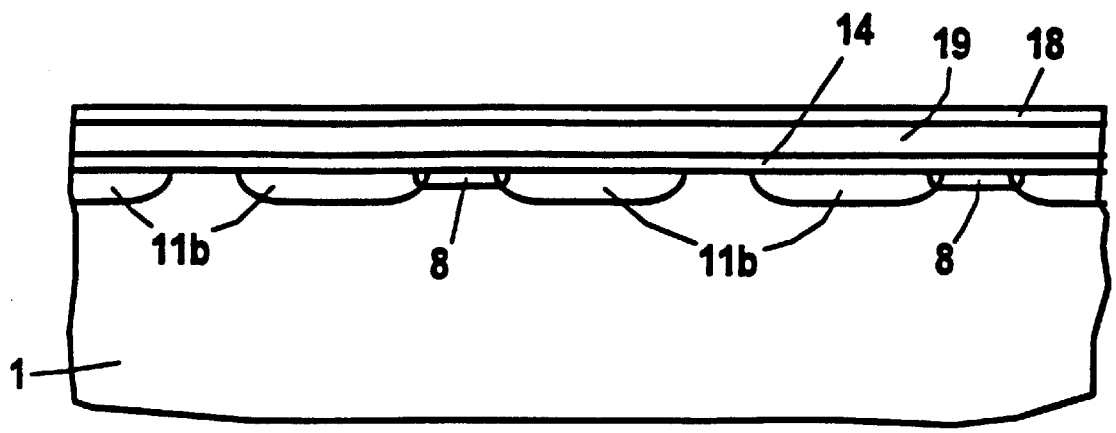
FIG. 9 shows the section designated by IX—IX in FIG. 8.
Figure 10:
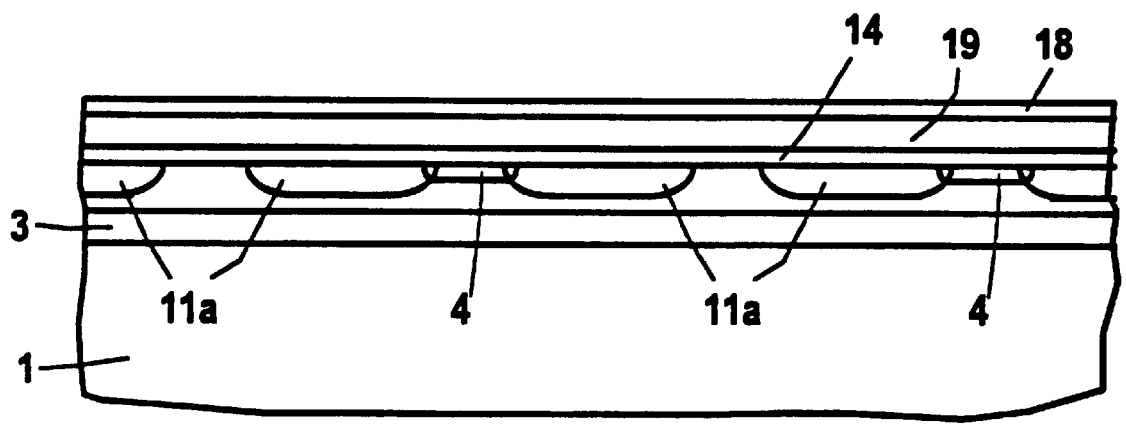
FIG. 10 shows the section designated by X—X in FIG. 8.

The Si$_3$N$_4$ spacers 17 are subsequently removed. The oxidizable conductive layer 15 is structures in an etching process which attacks the oxidizable conductive layer 15 selectively with respect to the oxide mask 18. Word lines 19 running parallel to the longitudinal trenches 6 are produced in the process on the bottom of the longitudinal trenches 6 and also between neighboring longitudinal trenches 6 (see FIG. 8, FIG. 9 and FIG. 10). The selective oxidation for forming the oxide mask 18 makes it possible to structure the word lines 19 in a self-aligned manner with respect to the course of the longitudinal trenches 6. The width of such word lines 19 is less than the minimum structure size F-particularly on the bottom of the longitudinal trenches 6.

Figure 11:
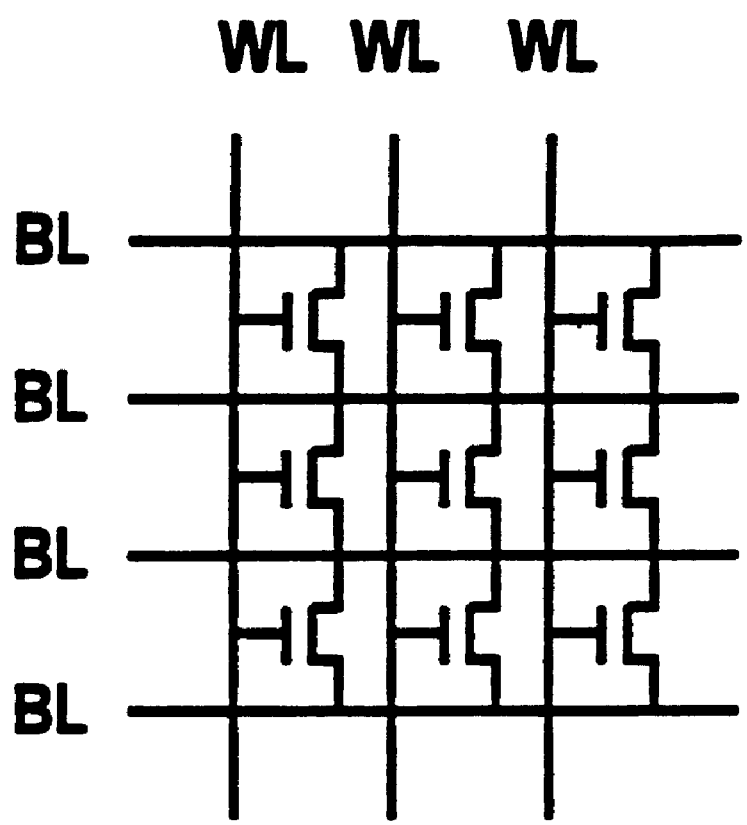
FIG. 11 shows a circuit diagram of the read-only memory cell arrangement.

The read-only memory cell arrangement is wired up in a NOR configuration (see FIG. 11). This circuit architecture enables access to each individual memory cell within short time constants. In FIG. 11, the word lines are designated by WL and the bit lines by BL.

The read-only memory cell arrangement is completed by deposition of an intermediate oxide. Contact holes are subsequently etched wherein the side walls of the contact holes are provided with insulating spacers and wherein the contact holes are filled with tungsten, for example. Finally, a metallization plane is produced by depositing a metal layer and structuring the metal layer (not illustrated).

The gate dielectric 14 may alternatively be formed from a layer sequence SiO$_2$, Si$_3$N$_4$ and SiO$_2$ (ONO). As such, the read-only memory cell arrangement is one-time programmable by electron injection from the channel region of the MOS transistors into the gate dielectric. Electrons captured in the gate dielectric increase the threshold voltage of the MOS transistor. Accordingly, the two channel implantations for setting different threshold voltages are omitted.

A suitable choice of the voltage conditions during the injection of electrons makes it possible to set different threshold voltages in order to represent a plurality of logic values.

Although the present invention has been described with reference to specific embodiments, those of skill in the art will recognize that changes may be made thereto without departing from the spirit and scope of the invention as set forth in the hereafter appended claims.

What is claimed is:

1. A read-only memory cell arrangement, comprising:
   a semiconductor substrate;
   a plurality of longitudinal trenches formed in a main area of the semiconductor substrate, the plurality of longitudinal trenches being substantially parallel to each other;
   a plurality of individual memory cells formed in the semiconductor substrate, the plurality of individual memory cells arranged in rows which run substantially parallel to the plurality of longitudinal trenches and which are alternately positioned on the main area between adjacent longitudinal trenches and on respective bottoms of the longitudinal trenches, each of the plurality of individual memory cells including at least one MOS transistor;

a plurality of bit lines running transversely to the rows, each of the plurality of bit lines connected to source/drain regions of MOS transistors respectively arranged along different rows; and a plurality of word lines positioned above the rows, each of the plurality of word lines connected to gate electrodes of MOS transistors arranged along a single row.

2. A read-only memory cell arrangement as claimed in claim 1, further comprising:

a plurality of doped layers formed in the semiconductor substrate, each of the plurality of doped layers positioned between adjacent longitudinal trenches wherein conductive channels are prevented from forming between adjacent rows.

3. A read-only memory cell arrangement as claimed in claim 1, wherein:

the MOS transistors of memory cells arranged along a single row are connected in series;

source/drain regions of adjacent MOS transistors arranged along a single row are designed as a coherent doped region in the semiconductor substrate; and the source/drain regions connected to a bit line and arranged along different rows are connected to one another via doped regions on side walls of the plurality of longitudinal trenches.

4. A read-only memory cell arrangement as claimed in claim 1, wherein each MOS transistor has a respective threshold voltage dependent upon information stored in the MOS transistor's respective memory cell.

5. A read-only memory cell arrangement as claimed in claim 1, wherein each MOS transistor further includes a dielectric multilayer coating having at least one layer with an increased electron capture cross-section compared to at least one further layer.

6. A read-only memory cell arrangement as claimed in claim 5, wherein the multilayer coating includes at least one $SiO_2$ layer and at least one $Si_3N_4$ layer.

* * * * *